United States Patent
Zumstrull et al.

(10) Patent No.: US 6,274,967 B1
(45) Date of Patent: Aug. 14, 2001

(54) PIEZOELECTRIC ACTUATOR FOR A SERVO DRIVE, SERVO DRIVE WITH A PIEZOELECTRIC ACTUATOR AND METHOD OF PRODUCING A PIEZOELECTRIC ACTUATOR

(75) Inventors: Claus Zumstrull, Regensburg; Wilhelm Frank, Bamberg; Andreas Voigt, Regensburg; Carsten Schuh, Baldham; Günter Lewentz, Regensburg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/296,227

(22) Filed: Apr. 22, 1999

(30) Foreign Application Priority Data

Apr. 22, 1998 (DE) .............................. 198 18 068

(51) Int. Cl.$^7$ .................................................. H01L 41/08
(52) U.S. Cl. ........................................................ 310/328
(58) Field of Search ................................ 310/328, 338, 310/346, 325, 340, 345

(56) References Cited

U.S. PATENT DOCUMENTS

| | | | |
|---|---|---|---|
| 4,958,101 | * | 9/1990 | Takahashi et al. .................. 310/328 |
| 5,004,945 | * | 4/1991 | Tomita et al. ....................... 310/328 |
| 5,113,108 | * | 5/1992 | Yamashita et al. .................. 310/328 |
| 5,148,077 | | 9/1992 | Grawey et al. ...................... 310/328 |
| 5,208,506 | * | 5/1993 | Yamashita ............................ 310/328 |
| 5,239,223 | * | 8/1993 | Miyoshi ................................ 310/328 |
| 5,250,868 | * | 10/1993 | Shirasu ................................. 310/328 |
| 5,271,133 | * | 12/1993 | Dam et al. ....................... 310/328 X |
| 5,295,288 | | 3/1994 | Dam et al. ....................... 310/328 X |

FOREIGN PATENT DOCUMENTS

| | | |
|---|---|---|
| 38 33 109 A1 | 4/1990 | (DE) . |
| 38 44 134 C2 | 2/1992 | (DE) . |
| 197 15 487 A1 | 10/1998 | (DE) . |
| 0 319 038 A2 | 6/1989 | (EP) . |

OTHER PUBLICATIONS

International Patent Application WO 98/47188 (Fitzner et al.), dated Oct. 22, 1998.
Daniel J. Jendritza et al,: "Piezopower", TR Technische Rundschau, vol. 41, 1992, pp. 38–42.

* cited by examiner

*Primary Examiner*—Mark O. Budd
(74) *Attorney, Agent, or Firm*—Herbert L. Lerner; Laurence A. Greenberg; Werner H. Stemeer

(57) ABSTRACT

A servo drive includes a piezoelectric actuator contained in a drive housing. The actuator has an actuator stack surrounded by a hollow cylindrical spring element and an actuator casing disposed in the spring element. The spring element is clamped, together with the actuator stack, between an actuator cap and an actuator base. An elastic compound fills gaps between the drive housing and the spring element as well as between the spring element and the actuator casing, and damps an actuator motion. A piezoelectric actuator for the servo drive and a method of producing the piezoelectric actuator are also provided.

15 Claims, 4 Drawing Sheets

PIEZOELECTRIC ACTUATOR FOR A SERVO DRIVE, SERVO DRIVE WITH A PIEZOELECTRIC ACTUATOR AND METHOD OF PRODUCING A PIEZOELECTRIC ACTUATOR

BACKGROUND OF THE INVENTION

Field of the Invention

The invention relates to a piezoelectric actuator for a servo drive, a servo drive with a piezoelectric actuator and methods for producing a piezoelectric actuator.

Piezoelectric actuators are used, for example, in a servo drive for a fuel injection valve in order to control an injection needle and therefore for controlling an injection process for an internal combustion engine.

German Patent DE 38 44 134 C2 has already disclosed a servo drive having a piezoelectric actuator with a piezoelectric actuator stack which is contained in a drive housing and is surrounded by a hollow cylindrical spring element. The actuator stack and the spring element are clamped between an actuator cap and a displaceable actuator base.

SUMMARY OF THE INVENTION

It is accordingly an object of the invention to provide a piezoelectric actuator for a servo drive, a servo drive with a piezoelectric actuator and a method of producing a piezoelectric actuator, which overcome the hereinafore-mentioned disadvantages of the heretofore-known devices and methods of this general type and which improve damping characteristics of the piezoelectric actuator and the servo drive.

With the foregoing and other objects in view there is provided, in accordance with the invention, a piezoelectric actuator for a servo drive, comprising an actuator stack; a hollow cylindrical spring element surrounding the actuator stack; an actuator cap and an actuator base between which the actuator stack and the spring element are clamped; an actuator casing disposed between the spring element and the actuator stack; electrical connections and connection elements disposed with the actuator stack in the actuator casing; and an elastic compound at least one of force-lockingly and form-lockingly connecting the spring element to the actuator casing.

In accordance with another feature of the invention, the spring element has cutouts formed therein at least partly containing the elastic compound. The spring element has a surface over which the cutouts are distributed.

In accordance with a further feature of the invention, the actuator casing has a surface with a structure in which the elastic compound is at least partially incorporated. The actuator casing may be made of the elastic compound and the elastic compound may be made of silicone.

With the objects of the invention in view, there is also provided a servo drive, comprising a drive housing; and a piezoelectric actuator disposed in the drive housing, the actuator including an actuator stack, a hollow cylindrical spring element surrounding the actuator stack, an actuator cap and an actuator base between which the hollow cylindrical spring element and the actuator stack are clamped, and an elastic compound at least one of force-lockingly and form-lockingly connecting the spring element to the drive housing.

In accordance with another feature of the invention, there is provided a diaphragm connected to the actuator base and having a central opening through which part of the actuator base protrudes outwardly, the drive housing having end openings closed off by the actuator cap and by the diaphragm. The drive housing has an inner surface with a structure in which the elastic compound is at least partially incorporated. As mentioned above, the spring element may have cutouts formed therein in which the elastic compound is at least partially incorporated and the spring element may have a surface over which the cutouts in the spring element are distributed.

In accordance with a further feature of the invention, there is provided an actuator casing disposed between the spring element and the actuator stack, the actuator casing having a surface with a structure in which the elastic compound is at least partially incorporated. The actuator casing may be made of the elastic compound. The elastic compound may be made of silicone and the drive housing may be made of INVAR.

With the objects of the invention in view, there is additionally provided a method of producing the piezoelectric actuator, which comprises placing the actuator stack, the electrical connections and the connection elements into a hollow profile of the actuator casing; filling the hollow profile with the elastic compound; placing the actuator casing into the spring element and defining an interspace therebetween; clamping end surfaces of the actuator stack disposed in the actuator casing between the actuator base and the actuator cap; connecting the actuator cap and the actuator base to the spring element; and at least partly filling the interspace between the spring element and the actuator casing with the elastic compound.

With the objects of the invention in view, there is furthermore provided a method of producing the piezoelectric actuator, which comprises placing the actuator stack, the electrical connections and the connection elements into the spring element; closing off ends of the spring element and of the actuator stack with the actuator base and the actuator cap; connecting the actuator cap and the actuator base to the spring element; and filling an interior of the hollow cylindrical spring element with the elastic compound.

In accordance with a concomitant mode of the invention, there is provided a method of producing the piezoelectric actuator, which comprises providing the actuator stack, the electrical connections and the connection elements with a passivation layer before placing them into the spring element.

One advantage of the invention is that the damping properties of the servo drive are improved and therefore the reliability and the accuracy of the servo drive are increased. A further advantage is that the components of the servo drive are electrically well insulated from one another and are satisfactorily protected from external environmental influences.

Other features which are considered as characteristic for the invention are set forth in the appended claims.

Although the invention is illustrated and described herein as embodied in a piezoelectric actuator for a servo drive, a servo drive with a piezoelectric actuator and a method of producing a piezoelectric actuator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
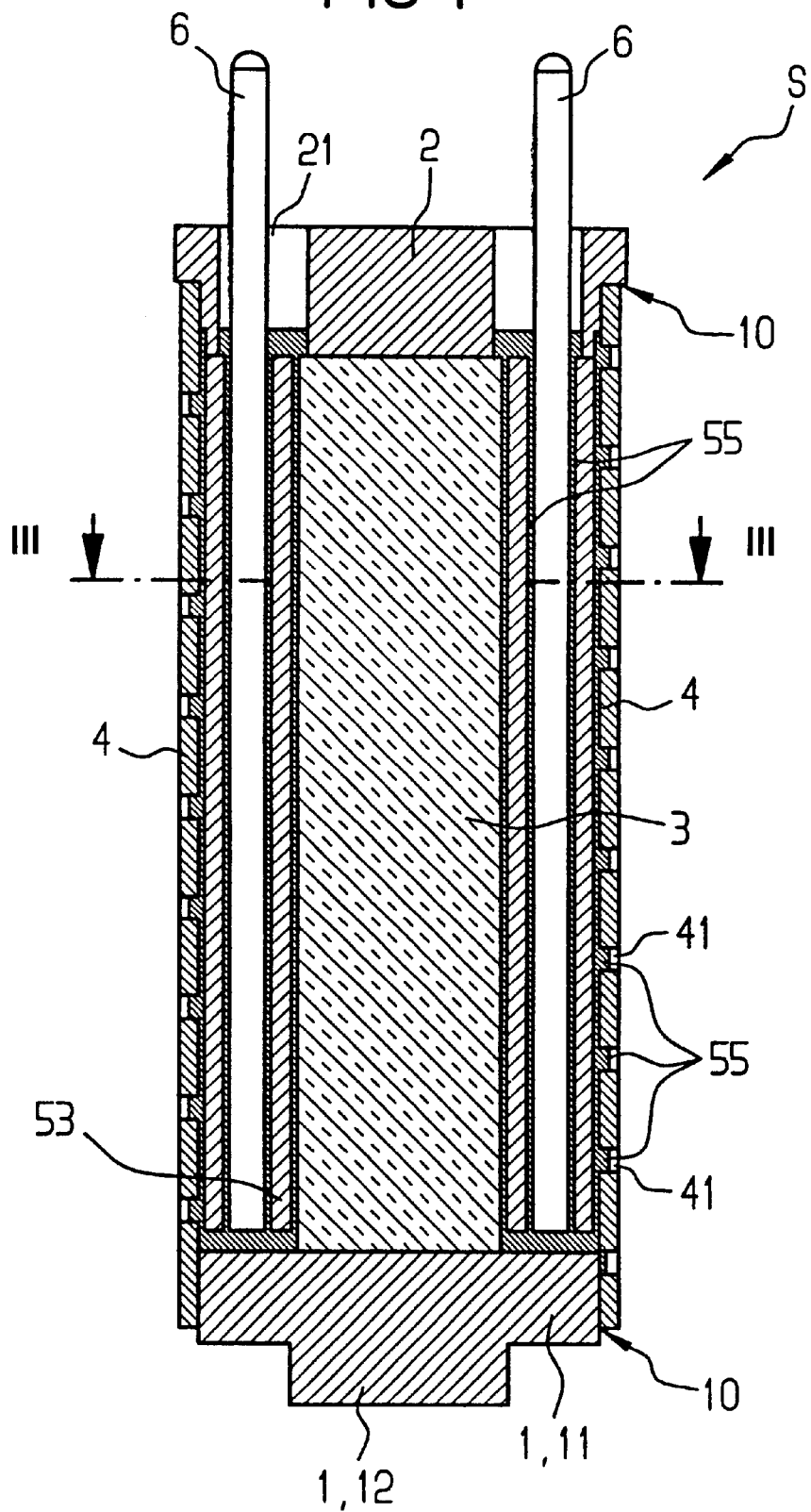
FIG. 1 is a diagrammatic, longitudinal-sectional view through an actuator, which is taken along a line I—I through an actuator shown in FIG. 3, in the direction of the arrows.

Referring now to the figures of the drawings in detail and first, particularly, to FIG. 1 thereof, there is seen an actuator S which includes a spring element 4 that is constructed as a hollow cylinder and has openings which are closed off by an actuator base 1 and an actuator cap 2. The actuator base 1 and the actuator cap 2 preferably have a cylindrical construction. The spring element 4 surrounds an actuator casing 53 containing an actuator stack 3 and containing electrical connections 6. End surfaces of the actuator stack 3 are clamped flat between covering surfaces of the actuator cap 2 and of the actuator base 1. The actuator stack 3 is prestressed against expansion by the spring element 4 in the longitudinal direction.

The actuator cap 2 is subdivided in the axial direction by an annular shoulder which acts as a stop for the spring element 4 when the spring element 4 is being pretensioned during production, and thus advantageously simplifies production.

The electrical connections 6, which are preferably also contained by the actuator casing 53, have a pin-shaped structure, are oriented essentially parallel to the longitudinal axis of the actuator stack 3 and are passed to the outside through connection bushings 21 in the actuator cap 2, which are preferably constructed as holes.

Figure 2:
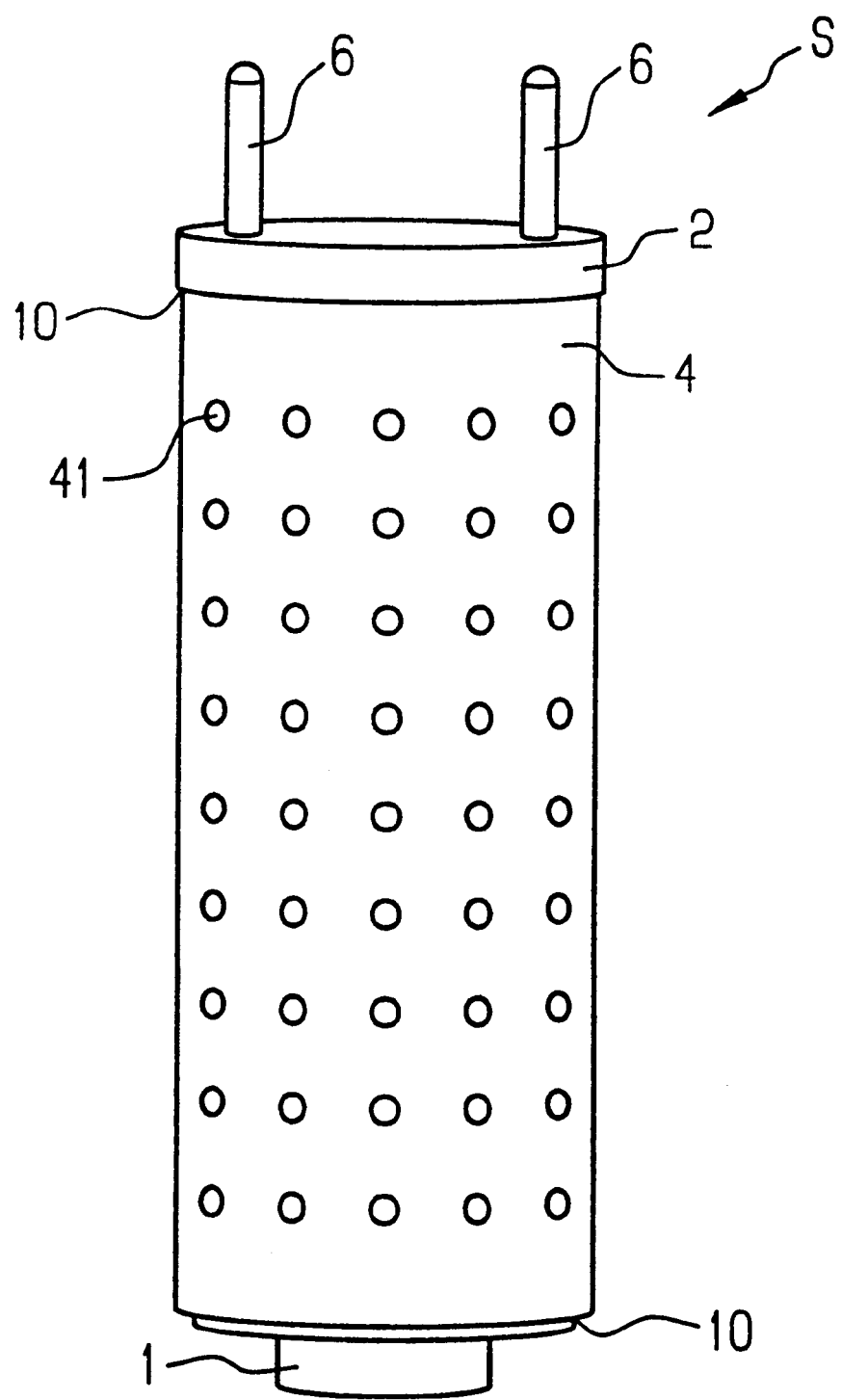
FIG. 2 is an overall perspective view of an actuator.

An external view of the actuator S is shown in FIG. 2. The electrical connections 6 of the actuator S project beyond the actuator cap 2. The hollow cylindrical spring element 4 located between the actuator cap 2 and the actuator base 1 has cutouts 41 which are preferably distributed over the surface of the spring element 4. The distribution and shape of the cutouts 41 determine the spring behavior of the spring element 4.

Figure 3:
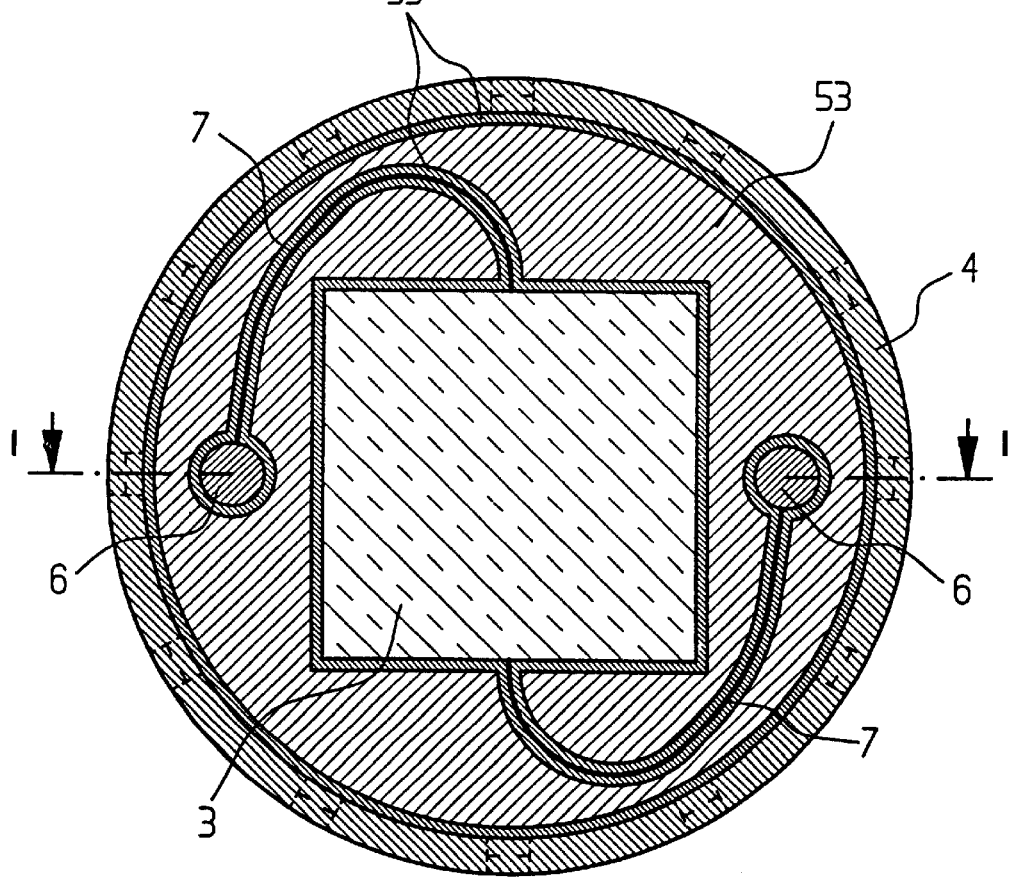
FIG. 3 is a cross-sectional view taken along a line III—III through the actuator of FIG. 1, in the direction of the arrows.

FIG. 3 shows the structure of the actuator S in a cross section which is taken along a line III—III in FIG. 1. The actuator stack 3 has a number of piezoelectric elements layered one above the other. The actuator casing 53 has a hollow profile which contains the actuator stack 3 together with the electrical connections 6 and connection elements 7. An elastic compound 55 fills the hollow profile of the actuator casing 53. The connection elements 7 are preferably constructed as electrically conductive films and connect the electrical connections 6 to electrodes disposed on the sides of the actuator stack 3. The actuator stack 3 is electrically driven through the use of the electrical connections 6.

The elastic compound 55 has the following material properties: it is electrically insulating, elastic, damping, heat resistant over a wide temperature range of, for example, −40° to +150° Celsius, and is resistant to fuels, e.g. Diesel. In addition, the elastic compound 55 adheres well to the surfaces of the bodies surrounding it, which produces a force-locking connection between the bodies. A force-locking connection is one which connects two elements together by force external to the elements, as opposed to a form-locking connection which is provided by the shapes of the elements themselves. The elastic compound 55 is preferably made of a cross-linked elastomer, of silicone or of LSR (liquid silicone rubber).

Additionally, the elastic compound 55 completely or at least partially fills the cutouts 41, a gap between the spring element 4 and the actuator casing 53 and an interspace between the electrical connections 6 and the actuator base 1. The elastic compound 55 also seals off the interior of the actuator S in the region of the connection bushings 21.

Figure 4:
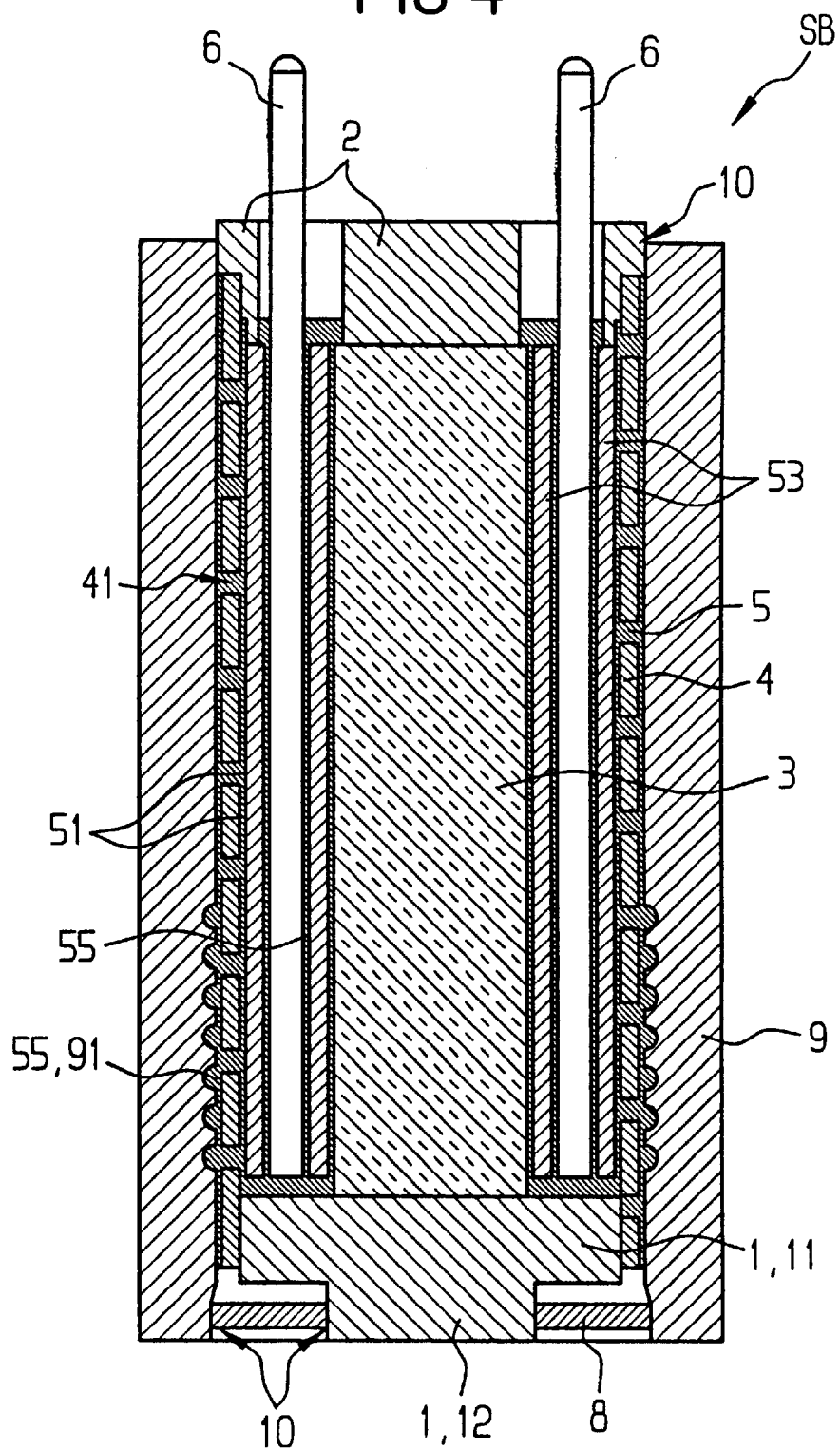
FIG. 4 is a longitudinal-sectional view through a servo drive with an actuator.

FIG. 4 shows an exemplary embodiment of a servo drive SB in which the actuator S is contained in a hollow cylindrical drive housing 9. The actuator cap 2 is connected to the drive housing 9 through the use of a circumferential joint seam 10 at one end opening of the drive housing 9. A diaphragm 8 is connected to an inner surface of the drive housing 9 through the use of a further circumferential joint seam 10 at an opposite opening.

The components of the servo drive SB are connected to one another durably and with a tight seal by using the joint seams 10 which are preferably produced by welding, e.g. laser welding.

The cylindrical actuator base 1 is subdivided in the axial direction by an annular shoulder into a base plate 11 and a base shoulder 12 with a smaller diameter. Part of the base shoulder 12 is led outside through a central opening in the diaphragm 8 and is connected to the diaphragm 8 at edges of the opening through the use of the joint seam 10.

The actuator S is axially deflected as a result of the actuator stack 3 being driven. Since the actuator cap 2 is firmly connected to the drive housing 9, the actuator base 1 of the servo drive SB is deflected toward the diaphragm 8. The diaphragm 8 moves with the actuator base 1 and deforms elastically in a corresponding manner. The deflection may, for example, drive a servo valve connected to the servo drive SB for a fuel injection valve, in particular for a Diesel injection valve, or it may drive an injection valve needle directly.

The elastic compound 55 is introduced into gaps between the drive housing 9 and the spring element 4, between the spring element 4 and the actuator casing 53 and between the actuator casing 53 and the actuator stack 3. The respectively opposite surfaces of the gaps are oriented approximately parallel to one another and move parallel to one another in opposite directions as a result of the axial deflection of the actuator stack 3 and the spring element 4. This motion exerts a shearing motion on the elastic and damping compound 55. The value of a resultant damping is dependent on the following:

the ratio of the amplitude of the shearing motion to the gap width, the length of the gap, and the filling level of the gap, i.e. what percentage of the gap is filled with the elastic compound 55.

The degree of damping can therefore advantageously be varied through the use of the above-mentioned parameters. In fuel injection valves, these damping measures are used to prevent the injection valve needle from oscillating or bouncing, which advantageously shortens injection times and prevents unacceptable injection processes.

During production, before interspaces are filled with the elastic compound, the surfaces of the bodies surrounding the elastic compound 55 are primed, i.e. a primer material is applied to the surfaces and serves to ensure better adhesion of the elastic compound 55 to the body surrounding it. Alternatively, the primer production step can be dispensed with if the primer material is contained in the elastic compound 55.

In one embodiment, the actuator casing 53 is made of polyamide (PA). PA is considerably less elastic than the elastic compound 55 and therefore only follows the deflection of the actuator stack 3 and of the spring element 4 to a minor extent. The actuator casing 53 has a hollow profile which contains the actuator stack 3, the electrical connections 6 and the connection elements 7. The method of producing the actuator S with an actuator casing 53 preferably made of PA includes the following production steps:

The actuator stack 3, the electrical connections 6 and the connection elements 7 are placed into the hollow profile of the actuator casing 53.

The hollow profile is then filled with the elastic compound 55, so that the actuator stack 3, the electrical connections 6 and the connection elements 7 are embedded elastically in the actuator casing 53.

The actuator casing 53 is placed into the spring element 4.

The end surfaces of the actuator stack 3 are clamped between the actuator base 1 and the actuator cap 2.

The actuator cap 2 and the actuator base 1 are connected to the spring element 4 through the use of the joint seam 10.

The interspace between the spring element 4 and the actuator casing 53 is at least partly filled with the elastic compound 55.

The order of the last three production steps can differ from the exemplary embodiment described above.

In a further exemplary embodiment, the actuator casing 53 is made of the elastic compound 55, preferably of silicone. The method of producing the actuator S with an actuator casing 53 made of the elastic compound 55 includes the following production steps:

At least part of the actuator stack 3, the electrical connections 6 and the connection elements 7 are coated with a passivation layer which is preferably made of the elastic compound 55, for example of silicone, and protects the coated components during further processing.

The actuator stack 3, the electrical connections 6 and the connection elements 7 are placed into the spring element 4.

The ends of the spring element 4 and of the actuator stack 3 are closed off by the actuator base 1 and the actuator cap 2, which prestresses the actuator stack 3.

The interior of the hollow cylindrical spring element 4 is filled with the elastic compound 55, preferably through the cutouts 41 and/or the connection bushings 21, thereby producing the actuator casing 53 at the same time. The cutouts 41, which are distributed, preferably uniformly, over the surface of the spring element 4, advantageously simplify rapid introduction of the elastic compound 55 in this process.

Before or after the interior of the spring element 4 has been filled with the elastic compound 55, the actuator base 1 and the actuator cap 2 are connected to the spring element 4 through the use of a circumferential joint seam 10.

This method advantageously dispenses with separate production of the actuator casing 53 and insertion of the actuator stack 3, the electrical connections 6 and the connection elements 7 into the actuator casing 53.

One embodiment of the invention is an actuator S with the elastic compound 55, which is introduced into the interspace between the spring element 4 and the actuator casing 53 that is preferably made of PA. The motion between the spring element 4 and the actuator casing 53 is damped by the elastic compound 55. The motion is damped further if a narrow gap is formed between the actuator stack 3 and the actuator casing 53, and the elastic compound 55 is introduced into this gap.

A further embodiment of the invention is a servo drive SB with an actuator S, in which the elastic compound 55 is introduced into the interspace between the spring element 4 and the drive housing 9. According to the invention, the motion between the spring element 4 and the drive housing 9 is damped by the elastic compound 55. In this embodiment, the actuator casing 53 is made of the elastic compound 55. The actuator stack 3 moves in relation to the spring element 4 and this motion is damped slightly by the elastic compound 55 of the actuator casing 53 due to the large distance between the actuator stack 3 and the spring element 4. Further embodiments are produced by combining the features of the embodiments of the invention. Advantageously, combining the features can be used to set the degree of motion damping.

Form-locking advantageously produces stronger, permanent adhesion of the elastic compound 55 to the surfaces surrounding it and therefore a more reliable force-locking. This is accomplished by structuring the surfaces surrounding the elastic compound 55, e.g. through the use of circumferential depressions 91 (annular groove) in the inner surface of the actuator housing 9, through the use of depressions in the surface of the actuator casing 53 or through the use of the cutouts 41 in the spring element 4.

The actuator stack 3, the electrical connections 6 and the connection elements 7 are advantageously protected from external environmental influences in a number of ways, namely by the actuator casing 53, the elastic compound 55 and the circumferential joint seams 10.

The material of the drive housing 9 has a very low thermal expansion coefficient and is preferably made of INVAR (35% Ni, 65% Fe).

We claim:

1. A piezoelectric actuator for a servo drive, the piezoelectric actuator comprising:
    an actuator stack;
    a hollow cylindrical spring element surrounding said actuator stack;
    an actuator cap and an actuator base between which said actuator stack and said spring element are clamped;
    an actuator casing disposed between said spring element and said actuator stack;
    electrical connections and connection elements disposed with said actuator stack in said actuator casing; and
    an elastic compound connecting and locking said spring element to said actuator casing.

2. The piezoelectric actuator for a servo drive according to claim 1, wherein said spring element has cutouts formed therein at least partly containing said elastic compound.

3. The piezoelectric actuator for a servo drive according to claim 2, wherein said spring element has a surface over which said cutouts in said spring element are distributed.

4. The piezoelectric actuator for a servo drive according to claim 1, wherein said actuator casing has a surface with a structure in which said elastic compound is at least partially incorporated.

5. The piezoelectric actuator for a servo drive according to claim 1, wherein said actuator casing is made of said elastic compound.

6. The piezoelectric actuator for a servo drive according to claim 1, wherein said elastic compound is made of silicone.

7. A servo drive, comprising:

a drive housing; and a piezoelectric actuator disposed in said drive housing, said actuator including:

an actuator stack, a hollow cylindrical spring element surrounding said actuator stack, an actuator cap and an actuator base between which said hollow cylindrical spring element and said actuator stack are clamped, and an elastic compound connecting and locking said spring element to said drive housing.

8. The servo drive according to claim 7, including a diaphragm connected to said actuator base and having a central opening through which part of said actuator base protrudes outwardly, said drive housing having end openings closed off by said actuator cap and by said diaphragm.

9. The servo drive according to claim 7, wherein said drive housing has an inner surface with a structure in which said elastic compound is at least partially incorporated.

10. The servo drive according to claim 7, wherein said spring element has cutouts formed therein in which said elastic compound is at least partially incorporated.

11. The servo drive according to claim 10, wherein said spring element has a surface over which said cutouts in said spring element are distributed.

12. The servo drive according to claim 7, including an actuator casing disposed between said spring element and said actuator stack, said actuator casing having a surface with a structure in which said elastic compound is at least partially incorporated.

13. The servo drive according to claim 12, wherein said actuator casing is made of said elastic compound.

14. The servo drive according to claim 12, wherein said elastic compound is made of silicone.

15. The servo drive according to claim 7, wherein said drive housing is made of INVAR.

* * * * *